US008063707B2

(12) United States Patent  
Wang

(10) Patent No.: US 8,063,707 B2  
(45) Date of Patent: Nov. 22, 2011

(54) PHASE LOCKED LOOP

(75) Inventor: Ping-Ying Wang, Hsinchu (TW)

(73) Assignee: Mediatek Inc., Hsinchu (TW)

( * ) Notice: Subject to any disclaimer, the term of this patent is extended or adjusted under 35 U.S.C. 154(b) by 59 days.

(21) Appl. No.: 12/437,633

(22) Filed: May 8, 2009

(65) Prior Publication Data

US 2010/0283549 A1 Nov. 11, 2010

(51) Int. Cl.  
*H03L 7/00* (2006.01)

(52) U.S. Cl. ............... 331/11; 331/10; 331/16; 331/17; 331/34

(58) Field of Classification Search .................. 331/10, 331/11, 16, 17, 34  
See application file for complete search history.

(56) References Cited

U.S. PATENT DOCUMENTS

| | | | | |
|---|---|---|---|---|
| 5,739,709 A * | 4/1998 | Banno | .......................... | 327/156 |
| 6,614,316 B2 * | 9/2003 | Masenas et al. | ................. | 331/17 |
| 6,788,154 B2 * | 9/2004 | Maneatis | ........................ | 331/45 |
| 7,095,287 B2 * | 8/2006 | Maxim et al. | .................... | 331/44 |
| 2003/0128074 A1* | 7/2003 | Maxim et al. | .................... | 331/17 |
| 2005/0111605 A1* | 5/2005 | Loke et al. | .................... | 375/375 |

* cited by examiner

*Primary Examiner* — Joseph Chang  
*Assistant Examiner* — Jeffrey Shin  
(74) *Attorney, Agent, or Firm* — Thomas|Kayden

(57) ABSTRACT

Phase locked loop circuits capable of increasing an equivalent capacitance thereof to improve stability are provided, in which an integral part comprises a first phase frequency detector providing a phase error signal, a first charge pump circuit generating a control signal according to the phase error signal, a controllable oscillator providing an output clock according to the control signal, and a sampling adjustment unit decreasing the number of times the control signal is updated according to the phase error signal. A proportional part is coupled between the controllable oscillator and a reference clock and operated in a fraction mode.

16 Claims, 2 Drawing Sheets

PHASE LOCKED LOOP

BACKGROUND OF THE INVENTION

1. Field of the Invention

The invention relates to phase locked loops (PLLs), and more particularly, to a phase locked loop capable of improving stability without greatly increasing chip area thereof.

2. Description of the Related Art

Many different types of integrated circuits (IC) and non-integrated circuits employ clock generating circuits such as phase locked loops (PLL). Some examples of integrated circuits that employ clock generators include, but are not limited to, graphics processors, central processing units, microprocessors, and communication ICs or any other suitable IC that employs clock generators. In order to design a PLL having required characteristics (e.g. low phase noise), a loop filter in the PLL typically requires more than 10 nF of capacitance for stability of the PLL. However, a larger capacitance requires a larger chip area. Hence, there is a need to improve stability of PLLs without greatly increasing chip area.

BRIEF SUMMARY OF THE INVENTION

Embodiments of a phase locked loop are provided, in which an integral part comprises a first phase frequency detector providing a phase error signal, a first charge pump circuit generating a control signal according to the phase error signal, a controllable oscillator providing an output clock according to the control signal, and a sampling adjustment unit decreasing the number of times the control signal is updated according to the phase error signal. A proportional part is coupled between the controllable oscillator and a reference clock and operated in a fraction mode.

The invention also provides another embodiment of a phase locked loop, in which an integral part comprises a controllable oscillator providing an output clock according to a control signal, and a sampling adjustment unit decreasing an updating rate of the control signal. A proportional part is operated in a fraction mode and comprises a first phase frequency detector coupled to a reference clock and a first feedback clock, a first charge pump circuit coupled between the first phase frequency detector and the controllable oscillator, and a first frequency divider frequency-dividing the output clock by a first fractional divisor to generate the first feedback clock.

The invention also provides another embodiment of a phase locked loop, in which a proportional part is operated in a fraction mode to control a controllable oscillator according to a phase error between a reference clock and a first feedback clock. An integral part is operated in an integer mode and comprises first and second frequency dividers frequency-dividing an output clock generated by the controllable oscillator and the reference signal, respectively, to generate a frequency-divided output clock and a frequency-divided reference clock, such that integral part controls the controllable oscillator according to a phase error between the frequency-divided reference clock and the frequency-divided output clock.

The invention also provides an embodiment of a phase locked loop, in which a proportional part is operated in a fraction mode to control a controllable oscillator. An integral part controls the controllable oscillator and comprises a first frequency divider frequency-dividing an output clock generated by the controllable oscillator to generate a frequency-divided output clock, an AND logic unit selectively outputting a phase error signal from a phase frequency detector to a charge pump circuit according to an enabling signal, and a determining unit activating the enabling signal such that the AND logic unit outputs the phase error signal to the charge pump circuit, when a residue of the frequency-divided output clock is accumulated to a threshold value.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Certain terms are used throughout the description and claims to refer to particular system components. As one skilled in the art will appreciate, consumer electronic equipment manufacturers may refer to a component by different names. This document does not intend to distinguish between components that differ in name but not function.

Figure 1:
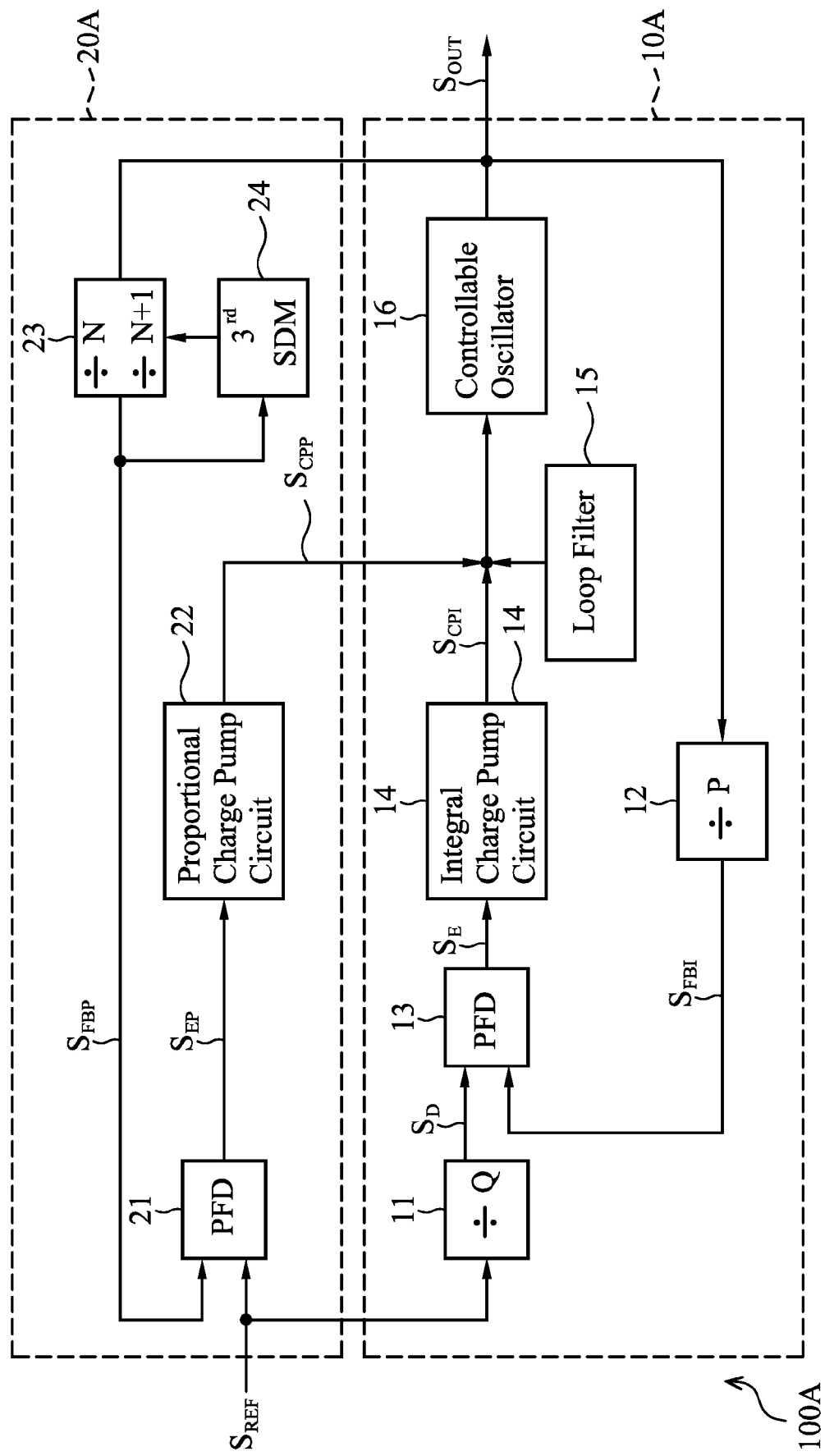
FIG. 1 shows an embodiment of a phase locked loop according to the invention.

In order to improve stability for phase locked loops (PLLs), embodiments of the invention increase equivalent capacitance of PLLs by decreasing an update ratio and/or update times of a control signal for a controllable oscillator therein. FIG. 1 shows an embodiment of a phase locked loop according to the invention. As shown, the phase locked loop 100A comprises an integral part 10A and a proportional part 20A, providing an output clock $S_{OUT}$ according to a reference clock $S_{REF}$. The integral part 10A comprises frequency dividers 11 and 12, a phase frequency detector 13, an integral charge pump circuit 14, a loop filter 15 and a controllable oscillator 16, and the proportional part 20A comprises a phase frequency detector 21, a proportional charge pump circuit 22, a frequency divider 23 and a sigma delta modulator (SDM) 24 (here takes a third-order sigma delta modulator as an example). In this embodiment, the integral part 10A is operated in an integer mode and the proportional part 20A is operated in a fraction mode.

The frequency divider 11 frequency-divides the reference clock $S_{REF}$ to generate a frequency-divided input clock $S_D$, and the frequency divider 12 frequency-divides the output clock $S_{OUT}$ to generate a frequency-divided output clock $S_{FBI}$. The phase frequency detector 13 compares the phase and/or frequency differences of the frequency-divided input clock $S_D$ with the frequency-divided output clock $S_{FBI}$ from the frequency divider 12. Based on these differences, the phase frequency detector 13 generates an error signal $S_E$. For example, the error signal $S_E$ comprises an up signal and/or a down signal (not shown). The up signal causes the integral charge pump circuit 14 to source a larger amount of current to the loop filter 15 (e.g., provide more positive current pulses) and the down signal causes the integral charge pump circuit 14 to sink more current from the loop filter 15 (e.g., provide more negative current pulses). As such, the current signal (i.e., control signal $S_{CPI}$) produced by the integral charge pump circuit 14 either sources current to or sinks current from the loop filter 15. The loop filter 15 translates the current signal (i.e. the control signal $S_{CPI}$) from the integral charge pump circuit 14 into a control voltage. The controllable oscillator 16 then translates the control voltage into the output clock $S_{OUT}$. For example, the controllable oscillator 16 can be a voltage controlled oscillator (VCO) or a current controlled oscillator (CCO), but is not limited thereto.

The frequency divider 23 is controlled by the sigma delta modulator 24 to frequency-divide the output clock $S_{OUT}$ to generate a frequency-divided output clock $S_{FBP}$. The phase frequency detector 21 compares the phase and/or frequency differences of the reference clock $S_{REF}$ with the frequency-divided output clock $S_{FBP}$ from the frequency divider 23. Based on these differences, the phase frequency detector 21 generates an error signal $S_{EP}$. Similarly, the error signal $S_{EP}$ comprises an up signal and/or a down signal (not shown). The up signal causes the proportional charge pump circuit 22 to source a larger amount of current to the loop filter 15 (e.g., provide more positive current pulses) and the down signal causes the proportional charge pump circuit 22 to sink more current from the loop filter 15 (e.g., provide more negative current pulses). As such, the current signal (i.e., control signal $S_{CPP}$) produced by the proportional charge pump circuit 22 either sources current to or sinks current from the loop filter 15.

In this embodiment, the frequency divider 23 and the sigma delta modulator 24 are configured to frequency-divide the output clock $S_{OUT}$ by a fractional divisor N.f, in which the fractional divisor N.f can be 10.1, 10.2, 10.3 . . . , or any fraction. For example, when the fractional division N.f is 10.1, the frequency divider 23 frequency-divides the output clock $S_{OUT}$ by 10 (i.e., N) for nine times and then frequency-divides the output clock $S_{OUT}$ by 11 (i.e., N+1) once, and the above frequency-dividing procedures are repeated. When the fractional divisor N.f is 10.2, and the frequency divider 23 frequency-divides the output clock $S_{OUT}$ by 10 (i.e., N) for four times and then frequency-divides the output clock $S_{OUT}$ by 11 (i.e., N+1) once, and the above frequency-dividing procedures are repeated. Also, the fractional divisor can be 10.5, where the frequency divider 23 frequency-divides the output clock $S_{OUT}$ by 10 (i.e., N) and 11 (i.e., N+1) in turns. As frequency of the reference clock $S_{REF}$ is 10 MHz, frequency of the output clock $S_{OUT}$ is 101 MHz, thus the fractional divisor is 10.1. With the frequency divider 11 absent, the output clock $S_{OUT}$ is required to be frequency-divided by 10.1 because the frequencies of the reference clock $S_{REF}$ and the output clock are 10 MHz and 101 MHz, respectively. As such, the phase frequency detector 13 compares the phase and/or frequency differences of two 10 MHz clocks (i.e., the reference clock $S_{REF}$ and the frequency-divided output clock $S_{FBI}$), and transfer function of a loop of the frequency divider 12, the phase frequency detector 13, the integral charge pump circuit 14, the loop filter 15 and the controllable oscillator 16 in the phase locked loop 100A can be represented as $$Hcon(s) = \left(Kp + \frac{Kz}{s \times C}\right) \times \frac{Kvco}{N \times s},$$

wherein $K_P$ represents a gain value of the path from phase frequency detector 21 to the proportional charge pump circuit 22; $K_Z$ represents a gain value of the path from phase frequency detector 13 to the integral charge pump circuit 14; s represents ω domain; C represents an equivalent capacitance of the loop filter 15; N represents the divisor of the frequency divider 12; and Kvco represents the gain of the controllable oscillator 16

The frequency divider 11 serves as a sampling adjustment unit and is configured to cooperate with the frequency divider 12 thereby decreasing the number of times the control signal $S_{CPI}$ is updated according to the phase error signal $S_E$. For example, the frequency divider 11 is configured to frequency-divide the reference clock $S_{REF}$ by an integral divisor Q, and the frequency divider 12 is configured to frequency-divide the output clock $S_{OUT}$ by an integral divisor P, in which $$\frac{P}{Q}$$

can be equal to the fractional divisor N.f. As such, the frequency $F_{OUT}$ of the output clock $S_{OUT}$ can be represented as $$F_{OUT} = N \cdot f \times F_{REF} = \frac{P}{Q} \times F_{REF},$$

wherein the $F_{REF}$ represents the frequency of the reference clock $S_{REF}$.

Because the frequency of the reference clock $S_{REF}$ is 10 MHz, the fractional divisor is 10.1 and the frequency of the output clock $S_{OUT}$ is 101 MHz, P and Q can be designed as integers, such as 101 and 10, respectively. Since the reference clock $S_{REF}$ of 10 MHz is frequency-divided by 10 and the output clock $S_{OUT}$ of 101 MHz is frequency-divided by 101, the phase frequency detector 13 compares the phase and/or frequency differences of two 1 MHz clocks (i.e., the frequency-divided input clock $S_D$ and the frequency-divided output clock $S_{FBI}$) rather than two 10 MHz clocks. Accordingly, the number of times the phase error signal $S_E$ is generated by the phase frequency detector 13 is decreased to one tenth of that of the phase locked loop 100A without the frequency divider 11, i.e., the sampling of the phase error signal $S_E$ is decreased to one tenth of that of the phase locked loop 100A without the frequency divider 11. Hence, the number of times the control signal $S_{CPI}$ is updated according to the phase error signal $S_E$ decreased to one tenth of that of the phase locked loop 100A without the frequency divider 11, i.e., the update rate of the control signal $S_{CPI}$ is decreased to be one tenth. As such, the charge/discharge period of the loop filter 15 is increased to 10 times that of the phase locked loop 100A without the frequency divider 11.

Thus, transfer function of a loop of the frequency divider 12, the phase frequency detector 13, the integral charge pump circuit 14, the loop filter 15 and the controllable oscillator 16 in the phase locked loop 100A can be represented as $$Hopen(s) = \left(Kp + \frac{Kz}{Q \times s \times C}\right) \times \frac{Kvco}{N \times s}.$$

Comparing the above two transfer functions, person skilled in the art can understand that the equivalent capacitance of loop filter 15 in the phase locked loop 100A is Q times that of the phase locked loop 100A without the frequency divider 11, and thus, the system stability of the phase locked loop 100A is improved accordingly because system stability of PLLs is proportional to the equivalent capacitance of the loop filter therein.

Figure 2:
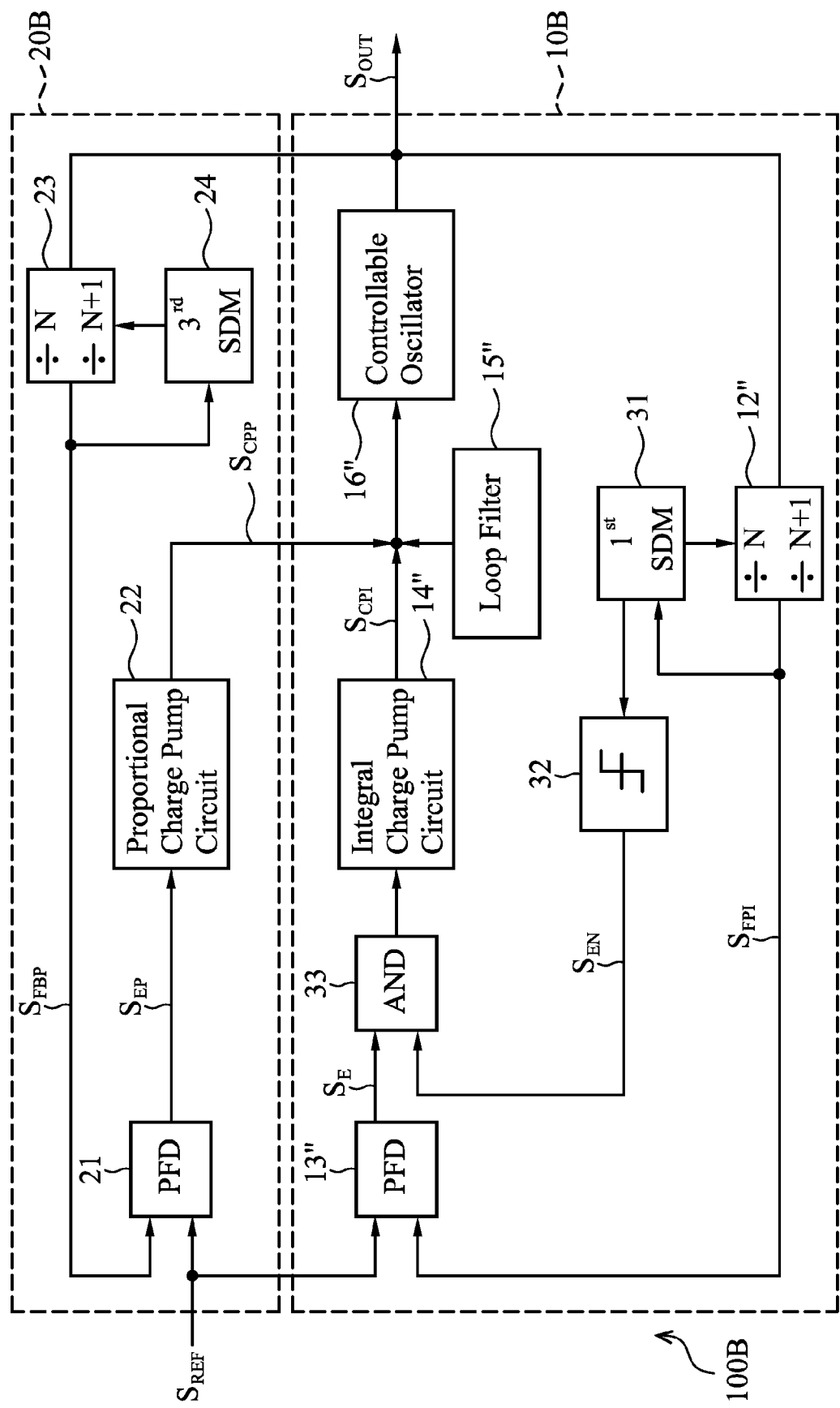
FIG. 2 shows another embodiment of the phase locked loop according to the invention.

FIG. 2 shows another embodiment of the phase locked loop according to the invention. As shown, the phase locked loop 100B is similar to the phase locked loop 100A, differing only, in that a sampling adjustment unit comprising a determining unit 32 and an AND logic unit 33 is configured to decrease a ratio of the phase error signal $S_E$ output to the integral charge pump circuit 14" from the phase frequency detector 13", such that the number of times the control signal $S_{CPI}$ is updated according to the phase error signal $S_E$ is decreased. Operations and structures of the proportional part 20B are similar to those of the proportional part 20A, and thus are omitted for simplification.

The frequency divider 12" is controlled by an one-order sigma delta modulator (SDM) 31 to frequency-divide the output clock $S_{OUT}$ to generate a frequency-divided output clock $S_{FBI}$. In this embodiment, the frequency divider 12" is controlled to frequency-divide the output clock $S_{OUT}$ by the fractional divisor N.f, which is similar to the frequency divider 23, thus the frequency divider 12" and the frequency divider 23 can be implemented to be a single element to save the layout area. The phase frequency detector 13" compares the phase and/or frequency differences of the reference clock $S_{REF}$ with a frequency-divided output clock $S_{FBI}$ from the frequency divider 12". Based on these differences, the phase frequency detector 13" generates an error signal $S_E$. For example, the error signal $S_E$ comprises an up signal and/or a down signal. The up signal causes the integral charge pump circuit 14" to source a larger amount of current to the loop filter 15" (e.g., provide more positive current pulses) and the down signal causes the integral charge pump circuit 14" to sink more current from the loop filter 15" (e.g., provide more negative current pulses). As such, the current signal (i.e., control signal $S_{CPI}$) produced by the integral charge pump circuit 14" either sources current to or sinks current from the loop filter 15". The loop filter 15" translates the current signal (i.e. the control signal $S_{CPI}$) from the charge pump circuit 14" into a control voltage. The controllable oscillator 16" then translates the control voltage into the output clock $S_{OUT}$.

The SDM 31 accumulates the residue (i.e., ".f") generated as the frequency divider 12" frequency-divides the output clock $S_{OUT}$, enabling the frequency divider 12" to selectively frequency-divide the output clock $S_{OUT}$ by N or N+1 according to the accumulated residue. For example, the SDM 31 enables the frequency divider 12" to frequency-divide the output clock $S_{OUT}$ by N when the accumulated residue has not overflowed and enables the frequency divider 12" to frequency-divide the output clock $S_{OUT}$ by N+1 when the accumulated residue has overflowed, but is not limited thereto. The determining unit 32 determines whether the accumulated residue is identical to or greater than a predetermined threshold value, and activates an enabling signal $S_{EN}$ when the accumulated residue is identical to the predetermined threshold value. The AND logic unit 33 comprises two input terminals receiving the error signal $S_E$ from the phase frequency detector 13" and the enabling signal $S_{EN}$ from the determining unit 32, respectively, and outputs the received the error signal $S_E$ to the integral charge pump circuit 14" when the enabling signal $S_{EN}$ is activated. Therefore, in some embodiments, only the proportional part 20B of the phase locked loop 100B processes the reference clock $S_{REF}$, and until the determining unit 32 determines the accumulated residue is identical to or greater than a predetermined threshold value, the integral part 10B joins in the process of the reference clock $S_{REF}$.

For example, it is assumed that frequencies of the reference clock $S_{REF}$ and the output clock $S_{OUT}$ are 10 MHz and 101 MHz respectively, and the frequency divider 12" is controlled to frequency-divide the output clock $S_{OUT}$ by 10.1 (i.e., the fractional divisor). The SDM 31 accumulates the residue (i.e., ".f") generated as the frequency divider 12" frequency-divides the output clock $S_{OUT}$ by 10. When the accumulated residue has overflowed, the SDM 31 enables the frequency divider 12" to frequency-divide the output clock $S_{OUT}$ by 11, and the accumulated residue is reset and becomes zero at this time. When determining that the accumulated residue is zero, the determining unit 32 activates the enabling signal $S_{EN}$ such that the AND logic unit 33 outputs the phase error signal $S_E$ from the phase frequency detector 13" to the integral charge pump circuit 14". Namely, the phase error signal $S_E$ is output to the integral charge pump circuit 14" from the phase frequency detector 13" only when the accumulated residue has overflowed (i.e., the output clock $S_{OUT}$ is frequency-divided by 11).

In this embodiment, because the fractional divisor is 10.1, the frequency divider 12" frequency-divides the output clock $S_{OUT}$ by 10 for nine times and then frequency-divides the output clock $S_{OUT}$ by 11 once, and the above frequency-dividing procedures are repeated. Accordingly, the number of times (or ratio) the phase error signal $S_E$ from the phase frequency detector 13 being output to the integral charge pump circuit 14" is decreased, is one tenth that of the phase locked loop 100B without the sampling adjustment unit (i.e., the determining unit 32 and the AND logic unit 33). Hence, the number of times of the control signal $S_{CPI}$ is updated according to the phase error signal $S_E$ is decreased to one tenth that of the phase locked loop 100B without the sampling adjustment unit, and thus, the update rate of the control signal $S_{CPI}$ is decreased to be one tenth. As such, a person skilled in the art can understand that the equivalent capacitance of the phase locked loop 100B is 10 times that of the phase locked loop 100B without the sampling adjustment unit, and thus, the system stability of the phase locked loop 100B is improved accordingly because system stability of PLLs is proportional to the equivalent capacitance of the loop filter therein.

In some embodiments, the fractional divisor can be 10.2, and the frequency divider 12" frequency-divides the output clock $S_{OUT}$ by 10 for four times and then frequency-divides the output clock $S_{OUT}$ by 11 once, and the above frequency-dividing procedures are repeated. Because the phase error signal $S_E$ is output to the integral charge pump circuit 14" from the phase frequency detector 13" only when the accumulated residue has overflowed (i.e., the output clock $S_{OUT}$ is frequency-divided by 11), the number of times (or ratio) the phase error signal $S_E$ from the phase frequency detector 13" being output to the integral charge pump circuit 14" is decreased, is one fourth that of the phase locked loop 100B without the sampling adjustment unit. As such, the equivalent capacitance of the phase locked loop 100B is 10 times that of the equivalent capacitance of the phase locked loop 100B without the sampling adjustment unit. Also, the fractional divisor can be 10.5, wherein the frequency divider 12" frequency-divides the output clock $S_{OUT}$ by 10 and 11, in turns. Accordingly, the number of times (or ratio) the phase error signal $S_E$ from the phase frequency detector 13" being output to the integral charge pump circuit 14" is decreased, is half that of the phase locked loop 100B without the sampling adjustment unit. Thus, the equivalent capacitance of the phase locked loop 100B is double that of the equivalent capacitance of the phase locked loop 100B without the sampling adjustment unit.

Thus, the embodiments of the phase locked loops can increase the equivalent capacitance thereof to improve stability without greatly increasing chip area thereof.

Although the invention has been described in terms of preferred embodiment, it is not limited thereto. Those skilled in the art can make various alterations and modifications without departing from the scope and spirit of the invention.

Therefore, the scope of the invention shall be defined and protected by the following claims and their equivalents.

What is claimed is:

1. A phase locked loop, comprising:
an integral part, comprising:
a first phase frequency detector providing a phase error signal;
a first charge pump circuit generating a control signal according to the phase error signal;
a controllable oscillator providing an output clock according to the control signal; and
a sampling adjustment unit decreasing the number of times the control signal is updated according to the phase error signal; and
a proportional part coupled between the controllable oscillator and a reference clock and operated in a fraction mode,
wherein the sampling adjustment unit decreases a ratio of the phase error signal output to the first charge pump circuit from the first phase frequency detector, such that the number of times to update the control signal according to the phase error signal is decreased.

2. The phase locked loop as claimed in claim 1, wherein the integral part is operated in an integer mode.

3. The phase locked loop as claimed in claim 2, wherein the integral part further comprises a first frequency divider for frequency-dividing the output clock by P and outputting a first frequency-divided output clock to the first phase frequency detector, and the sampling adjustment unit comprises a second frequency divider for frequency-dividing the reference clock by Q and outputting a frequency-divided input clock to the first phase frequency detector, in which P and Q are integers.

4. The phase locked loop as claimed in claim 3, wherein the proportional part comprises a third frequency divider for frequency-dividing the output clock by a fractional divisor such that the proportional part is operated in the fraction mode, in which the fractional divisor is equal to $$\frac{P}{Q}.$$

5. The phase locked loop as claimed in claim 1, wherein the integral part further comprises a first frequency divider for frequency-dividing the output clock by a fractional divisor and outputting a frequency-divided output clock to the first phase frequency detector, and the sampling adjustment unit comprises:
an AND logic unit with a first input terminal coupled to an output terminal of the first phase frequency detector and a second input coupled to an enabling signal; and
a determining unit activating the enabling signal such that the AND logic unit outputs the phase error signal to the first charge pump circuit, when a residue of the frequency-divided output clock is accumulated to a threshold value.

6. The phase locked loop as claimed in claim 1, wherein the integral part comprises a first frequency divider controlled by a first sigma delta modulator to divide the output clock by a first fractional divisor, and the proportional part comprises a second frequency divider controlled by a second sigma delta modulator to divide the output clock by a second fractional divisor.

7. The phase locked loop as claimed in claim 6, wherein the first sigma delta modulator is an N-order sigma delta modulator and the second sigma delta modulator is an M-order sigma delta modulator, and N>M.

8. The phase locked loop as claimed in claim 1, wherein the controllable oscillator comprises a voltage controlled oscillator or a current controlled oscillator.

9. A phase locked loop, comprising:
an integral part, comprising:
a controllable oscillator providing an output clock according to a control signal; and
a sampling adjustment unit, decreasing an updating rate of the control signal; and
a proportional part operated in a fraction mode, and comprising:
a first phase frequency detector coupled to a reference clock and a first feedback clock;
a first charge pump circuit coupled between the first phase frequency detector and the controllable oscillator; and
a first frequency divider frequency-dividing the output clock by a first fractional divisor to generate the first feedback clock,
wherein the sampling adjustment unit decreases a ratio of the phase error signal output to a second charge pump circuit from a second phase frequency detector in the integral part, such that the number of times to update the control signal according to the phase error signal is decreased.

10. The phase locked loop as claimed in claim 9, wherein the sampling adjustment unit comprises a second frequency divider for frequency-dividing the reference clock by Q and outputting a frequency-divided input clock, and the integral part further comprises:
a third frequency divider for frequency-dividing the output clock by P and outputting a second feedback clock;
the second phase frequency detector provides the phase error signal according to the second feedback clock and the frequency-divided input clock; and
the second charge pump circuit generates the control signal according to the phase error signal, in which P and Q are integers.

11. The phase locked loop as claimed in claim 10, wherein $$\frac{P}{Q}$$

is equaled to the first fractional divisor.

12. The phase locked loop as claimed in claim 9, wherein the integral part further comprises:
a second frequency divider for frequency-dividing the output clock by a second fractional divisor and outputting a second feedback clock;
the second phase frequency detector provides the phase error signal according to the second feedback clock and the reference clock; and
the second charge pump circuit generates the control signal according to the phase error signal,
wherein the sampling adjustment unit comprises:
an AND logic unit with a first input terminal coupled to an output terminal of the second phase frequency detector and a second input coupled to an enabling signal; and
a determining unit activating the enabling signal such that the AND logic unit outputs the phase error signal to the second charge pump circuit, when a residue of the second feedback clock from the second frequency divider is accumulated to a threshold value.

13. The phase locked loop as claimed in claim 12, wherein the first frequency divider is controlled by an N-order sigma delta modulator and the second frequency divider is controlled by an M-order sigma delta modulator, and N>M.

14. A phase locked loop, comprising:
   a proportional part operated in a fraction mode, controlling a controllable oscillator according to a first phase error between a reference clock and a first feedback clock and the proportional part comprising a first phase frequency detector receiving the reference clock and the first feedback clock to generate the first phase error; and
   an integral part operated in an integer mode, comprising:
      first and second frequency dividers for frequency-dividing an output clock generated by the controllable oscillator and a reference signal, respectively, to generate a frequency-divided output clock and a frequency-divided reference clock, such that integral part controls the controllable oscillator according to a second phase error between the frequency-divided reference clock and the frequency-divided output clock; and
      a second phase frequency detector receiving the frequency-divided output clock and the frequency-divided reference clock to provide the second phase error, wherein the proportional part comprises a third frequency divider for frequency-dividing the output clock by a fractional divisor, the first frequency divider for frequency-dividing the output clock by P, the second frequency divider for frequency-dividing the reference clock by Q, and $$\frac{P}{Q}$$

is equal to the fractional divisor.

15. A phase locked loop, comprising:
   a proportional part operated in a fraction mode, controlling a controllable oscillator; and
   an integral part controlling the controllable oscillator, comprising:
      a first frequency divider for frequency-dividing an output clock generated by the controllable oscillator to generate a frequency-divided output clock;
      an AND logic unit selectively outputting a phase error signal from a phase frequency detector to a charge pump circuit according to an enabling signal; and
      a determining unit activating the enabling signal such that the AND logic unit outputs the phase error signal to the charge pump circuit, when a residue of the frequency-divided output clock is accumulated to a threshold value.

16. The phase locked loop as claimed in claim 15, wherein the first frequency divider is controlled by an M-order sigma delta modulator, and the proportional part comprises a second frequency divider controlled by an N-order sigma delta modulator, and N>M.

* * * * *